United States Patent
Tao et al.

(10) Patent No.: US 6,828,248 B1
(45) Date of Patent: *Dec. 7, 2004

(54) METHOD OF PULL BACK FOR FORMING SHALLOW TRENCH ISOLATION

(75) Inventors: Hun-Jan Tao, Hsinchu (TW); Huan-Just Lin, Hsin-chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/637,350

(22) Filed: Aug. 8, 2003

(51) Int. Cl.[7] .......................................... H01L 21/302
(52) U.S. Cl. ...................... 438/711; 438/729; 438/424
(58) Field of Search ................ 438/706–744, 438/404, 424, 446; 257/623

(56) References Cited

U.S. PATENT DOCUMENTS

| | | | |
|---|---|---|---|
| 5,811,346 A | | 9/1998 | Sur et al. |
| 5,998,852 A | | 12/1999 | Berry et al. |
| 6,156,629 A | * | 12/2000 | Tao et al. .................... 438/535 |
| 6,265,317 B1 | | 7/2001 | Chiu et al. |
| 6,391,729 B1 | | 5/2002 | Hui |
| 6,524,964 B2 | * | 2/2003 | Yu .............................. 438/736 |
| 2003/0155329 A1 | * | 8/2003 | Su et al. ....................... 216/67 |
| 2003/0181048 A1 | * | 9/2003 | Huang et al. ............... 438/694 |

\* cited by examiner

Primary Examiner—Matthew Smith
Assistant Examiner—Calvin Lee
(74) Attorney, Agent, or Firm—Duane Morris LLP

(57) ABSTRACT

A method of pull back for a shallow trench isolation (STI) structure is provided. The method firstly provides a substrate having a hard mask layer disposed thereupon and a dielectric layer above the hard mask layer. Then a trench is formed within the hard mask layer, the dielectric layer and the substrate. Finally, the hard mask layer and the dielectric layer are pulled back by using a halogen containing etching process.

33 Claims, 4 Drawing Sheets

METHOD OF PULL BACK FOR FORMING SHALLOW TRENCH ISOLATION

BACKGROUND OF THE INVENTION

1. Field of the Invention

The present invention relates to a method for fabrication of a semiconductor integrated circuit. More particularly, the present invention relates to a method for forming a shallow trench isolation (STI) structure.

2. Description of the Related Art

Because of the high level integration of semiconductor integrated circuits, a variety of isolation techniques are proposed and used to provide electrical isolation between devices fabricated within the integrated circuits. Traditionally, local oxidation of silicon (LOCOS) is used to isolate the devices of integrated circuits fabricated within 0.35 micron (um) or 0.25 um semiconductor technology. Usually, LOCOS is formed by a thermal oxidation process. Because of the thermal oxidation process, Bird's Beak effects occur after LOCOS structures are formed. To eliminate or avoid the effects, larger spaces to separate the devices of integrated circuits are required.

However, higher level of integration of circuits is the trend in semiconductor fabrication. To avoid Bird's Beak effects and reduce the size of integrated circuits, shallow trench isolation (STI) has been gradually replacing the conventional semiconductor device isolating method, LOCOS, in quarter micron or deep submicron technology. Conventionally, a STI process uses a thick nitride layer as a hard mask. After a trench is formed within the silicon substrate and the nitride layer, an oxide layer is used to fill the trench. Then this nitride layer or hard mask performs as a chemical-mechanical polish (CMP) stop layer for removal of the oxide layer.

However, some problems still exist in STI. The interface of vertical sidewalls of the trench and the top surface of semiconductor substrate produces sharp corners. As a result, a gate dielectric layer subsequently deposited suffers from stress at the sharp corner regions. In addition, the electric field at sharp corners contributes to parasitic subthreshold leakage and degrades gate oxide integrity. Therefore, new methods and structures are provided to avoid the issues.

A method to eliminate the sharp corner issue by a pull-back process is provided in U.S. Pat. No. 6,265,317 called U.S. '317 hereafter. FIG. 1 is a schematic cross-sectional diagram illustrating a structure formed by the method disclosed in U.S. '317. A pad oxide layer 110 and a pad nitride layer 120 are sequentially formed upon a silicon substrate 100. A patterned photoresist layer is used to form a trench 130 within the silicon substrate 100, the pad oxide layer 110 and the pad nitride layer 120. After the removal of the photoresist layer, the pad nitride layer 120 is then briefly and selectively etched by phosphoric acid ($H_3PO_4$) solution and pulled back from the trench rim and exposes a small amount of the underlying pad oxide 110. Then a sputtering process is perfomed to round corners 140. However, the method still has some problems, such as overhang and the control of the $H_3PO_4$ wet-etching process.

Another top corner rounding method is disclosed in U.S. Pat. No. 6,391,729. Referring to FIG. 2, a pad oxide layer 210 and a pad nitride layer 220 are sequentially formed upon a silicon substrate 200. A patterned photoresist layer is used to form a trench 230 within the silicon substrate 200, the pad oxide layer 210 and the pad nitride layer 220. After removal of the photoresist layer, a sputtering technique is performed to substantially trim the entire pad nitride layer 220, and the pad oxide layer 210, while rounding the trench corners 240. However, because the entire pad nitride layer 220 is trimmed and damaged, it is difficult to control a subsequent chemical-mechanical polish (CMP) process used to remove a high density plasma (HDP) oxide layer. Moreover, the CMP process can result in non-uniformities of the substrate surface and cause deviations of critical condition (CD) in a following photographic process for gate patterns.

Accordingly, it is desirable to provide a method for forming a shallow trench isolation without the problems aforementioned.

SUMMARY OF THE INVENTION

A method of forming a shallow trench isolation (STI) structure includes providing a substrate having a hard mask layer disposed thereupon, and a dielectric layer above the hard mask layer. Then a trench is formed within the hard mask layer, the dielectric layer and the substrate. Finally, the hard mask layer and the dielectric layer are pulled back by a dry etching process using a halogen containing etching gas.

DESCRIPTION OF SOME EMBODIMENTS

Figure 1:
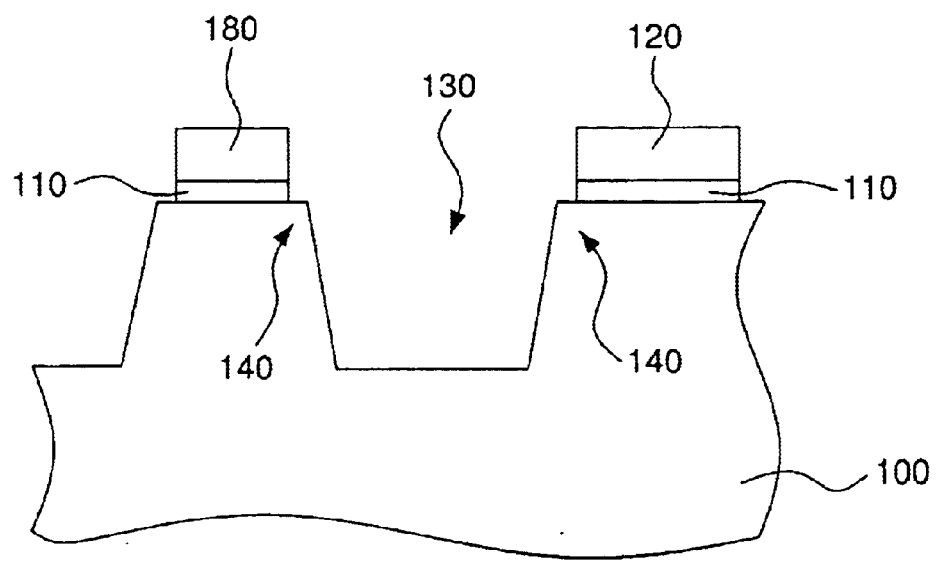
FIG. 1 illustrates a schematic cross-sectional structure of a prior art
Figure 2:
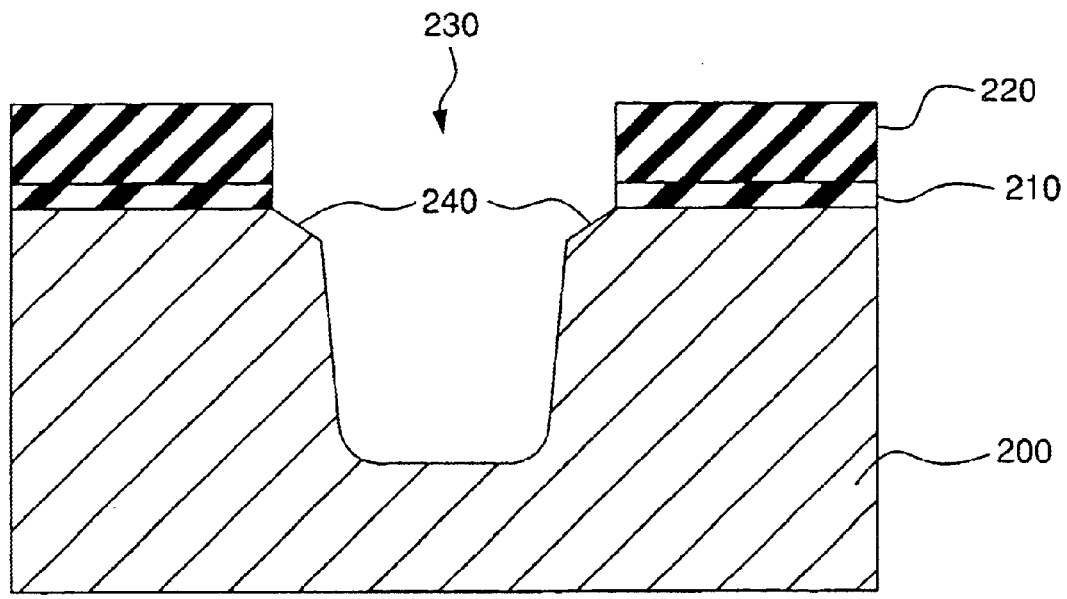
FIG. 2 illustrates a schematic cross-sectional structure of another prior art

FIGS. 3A-3E illustrates a series of schematic cross-sectional diagrams showing the method for forming a shallow trench isolation (STI) structure. A substrate 300 having a hard mask layer 320 disposed thereupon and a dielectric layer 330 above the hard mask layer 320 is provided. Then a trench 340 is formed within the hard mask layer 320, the dielectric layer 330 and the substrate 300. Finally, the hard mask layer 320 and the dielectric layer 330 are pulled back by a dry etching process 350 using a halogen containing etching gas.

Figure 3A:
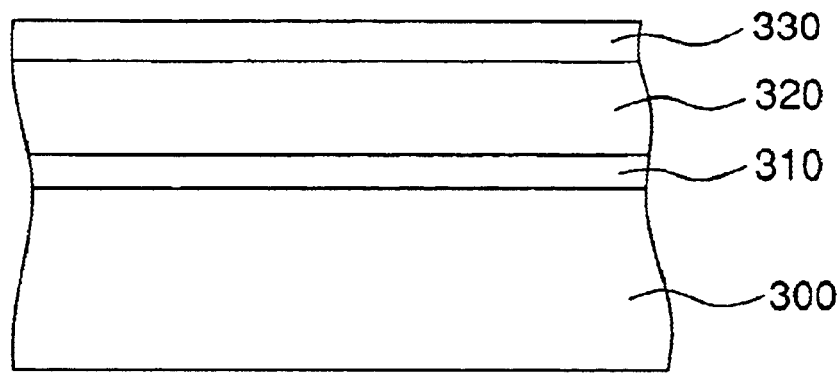
FIGS. 3A-3E show a series of schematic cross-sectional diagrams illustrating the method for forming a shallow trench isolation (STI) structure by the present invention.

Referring to FIG. 3A, it illustrates a structure after a first dielectric layer 310, a hard mask layer 320, and a second dielectric layer 330 are sequentially formed above a substrate 300.

The substrate 300 is a semiconductor substrate. It can be, for example, a silicon substrate, silicon-germanium substrate, silicon-on-insulator (SOI) substrate, or III–V compound substrate. In some preferred embodiments, the substrate is a silicon substrate. Usually, the first dielectric layer 310 is a pad oxide layer. The pad oxide layer 310 can be formed by a thermal oxidation process or chemical vapor deposition (CVD) process. It is preferred that the pad oxide layer 310 has a thickness from about 50 angstroms (Å) to about 140 Å. The hard mask layer 320 is a dielectric layer. It can be, for example, a silicon nitride layer or silicon oxynitride layer. In some embodiments, the hard mask layer 320 is a silicon nitride layer having a thickness from about 600 Å to about 2000 Å and can be formed by a thermal nitridation or CVD process. The second dielectric layer 330 can be, for example, a silicon oxynitride layer or silicon oxide layer. In some embodiments, the second dielectric layer 330 is a silicon oxynitride layer formed by a CVD process, and has a thickness from about 200 Å to about 600 Å. The second dielectric layer 330 acts as an etching protection layer of the hard mask layer 320 and acts as a photolithographic anti-reflective coating (ARC) layer for controlling depth of focus (DOF) of the photolithographic process, the dielectric layer 330 has a refractive index (n) constant from about 1.5 to about 2.5 and extinction coefficient (k) constant from about 0.1 to about 0.6.

Figure 3B:
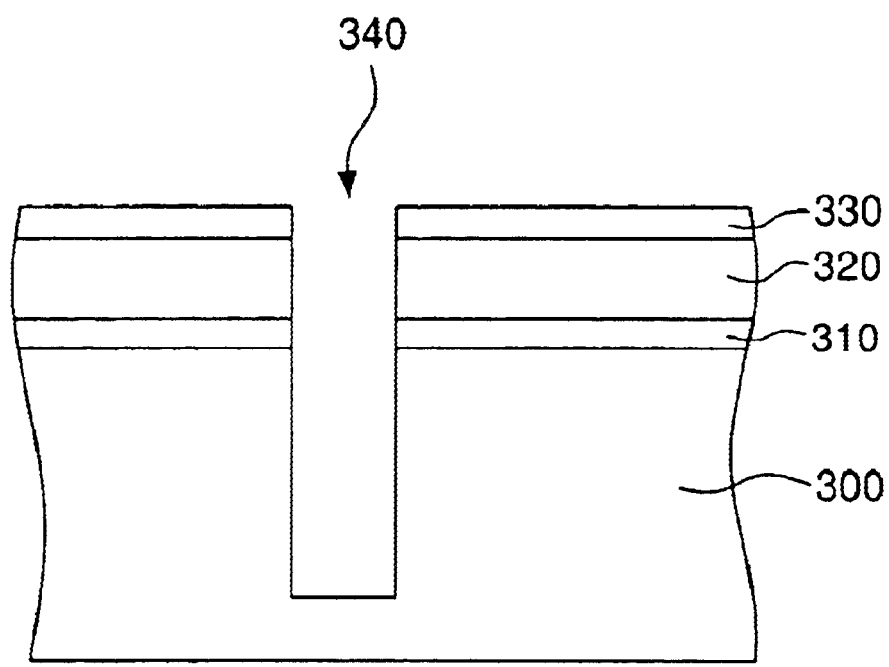

FIG. 3B illustrates a structure after a trench 340 is formed within the first dielectric layer 310, the hard mask layer 320, the second dielectric layer 330 and the substrate 300.

In accordance with the structure of FIG. 3B, a photoresist layer (not illustrated) is formed thereupon. Usually, a bottom anti-reflection coating (BARC) layer is formed under the photoresist layer to reduce interference and diffraction during a photolithographic process. In some embodiments, when the second dielectric layer is an oxynitride layer that can perform the same function of the BARC layer to prevent interference or diffraction, the BARC layer is not necessarily required. Then a patterned trench photoresist layer is formed by a traditional photolithographic process.

After the patterned trench photoresist layer is formed, a sequentially anisotropic etching process is performed to form the trench 340. The sequentially anisotropic etching can be performed by using some etching gases to remove the oxide layer, nitride layer or silicon. For example, $CF_4$, $CHF_3$, $C_2F_6$, $C_3F_8$, or $C_4F_8$ can be used as an etching gas for removal of silicon oxide. $CF_4$, $CHF_3$, $CH_2F_2$ or $NF_3$ can be used as an etching gas for removal of silicon nitride. Chlorine gas ($Cl_2$) or HBr, chlorine silane ($SiCl_4$) can be used as an etching gas for removal of silicon. $CHF_3$, $CF_4$, $CF_3Cl$, $C_2F_4$ or $C_2F_6$ can be used as an etching gas for removal of oxynitride.

After the trench 340 is formed, the photoresist layer can be removed by traditional photoresist-removing processes. It can be removed, for example, by a dry etching process using oxygen as a reaction gas or by a wet etching process using $H_2SO_4$ and $H_2O_2$ as reaction solutions. In some embodiments, if a dry etching process is used to remove the photoresist layer, an in-situ process can be performed. This means that the removal of the photoresist layer and the trench dry etching process can be performed in a same tool or chamber without transferring a wafer from a tool to another tool. The in-situ process can save the time for wafer transfer and reduce the risk of contamination on the wafer.

Figure 3C:
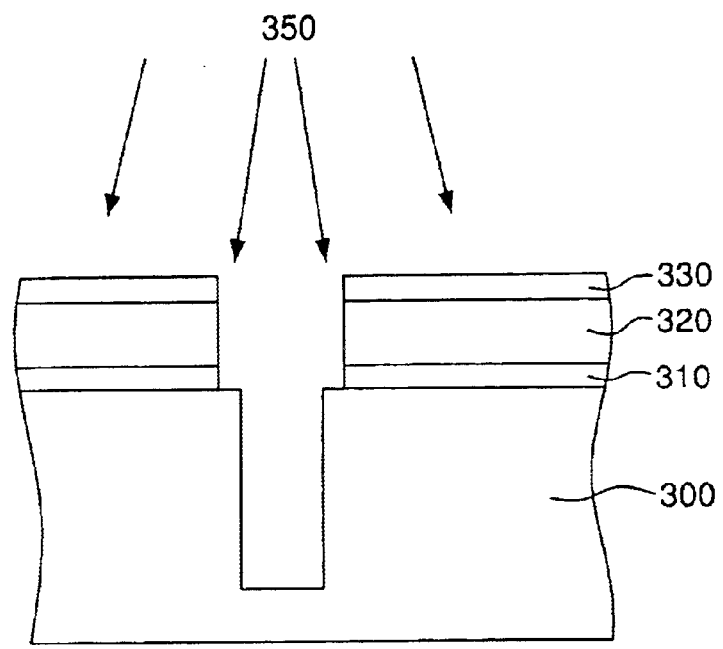

FIG. 3C illustrates a structure after the first dielectric layer 310, a hard mask layer 320, and a second dielectric layer 330 are pulled back by a dry etching process 350.

Beginning with the structure of FIG. 3B, a dry etching process 350 is applied to pull back the first dielectric layer 310, the hard mask layer 320, and the second dielectric layer 330. In some embodiments, the etching gas for the process is a halogen containing gas. It can be, for example, a fluorine containing gas selected from a group consisting of $C_xF_y$, $C_xH_yF_z$, $S_xF_y$, $N_xF_y$ and mixtures thereof. In addition, the etching gas may also include an inert gas, and a nitrogen containing gas. The nitrogen containing gas can be such as $N_2$, and the inert gas can be, for example, He, Ne, Ar, Kr or Xe. For some embodiments, the fluorine containing etching gas is $CF_4$, $CHF_3$, $CH_2F_2$, $NF_3$ or mixtures thereof. If $CF_4$ and $CHF_3$ are used as the etching gases in some embodiments, the flow rates of these gases are from about 10 to about 200 sccm, and from about 2 to about 200 sccm, respectively. In addition, the pressure in a reaction chamber for the pull-back process is about from 3 to about 100 mTorr.

In some embodiments, the fluorine to carbon ratio (F/C) in the fluorine containing etching gas is more than, or equal to, 1. In some embodiments, the dry etching process 350 has an etching rate in lateral direction more twice than in perpendicular direction. In addition, in some embodiments, the dry etching process is performed in an dual-power etching tool having a Transformer-Coupled Plasma (TCP) power and a bias power. Moreover, the TCP power is higher than the bias power. In some embodiments, the ratio of the TCP power over the bias power is more than 5. Usually, the TCP power is from about 200 watts to about 1000 watts, and the bias power is from about 0 to about 200 watts. In some embodiments, the ratio of TCP power over bias power from about 5 to about 10 can control the lateral/perpendicular etching rate ratio of the dry etching process 350 from about 2 to about 4.

Figure 3D:
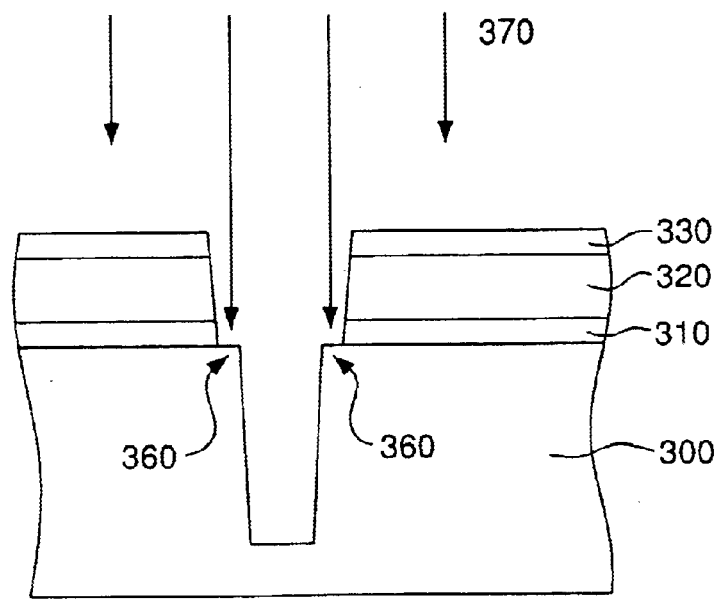

FIG. 3D illustrates a structure after a corner rounding process is applied to the structure of FIG. 3C.

After the process of pull-back, a traditional top corner rounding (TCR) process is performed to round corners 360 of the silicon substrate. The top corner rounding process can be performed, for example, by a physical process 370, i.e., ion bombardment, and includes exposing the substrate to a plasma treatment formed from a sputtering agent. However, in some embodiments, if the dry etching process 350 can pull back the multilayer structure while rounding the corners 360, the TCR process is not necessarily required.

Figure 3E:
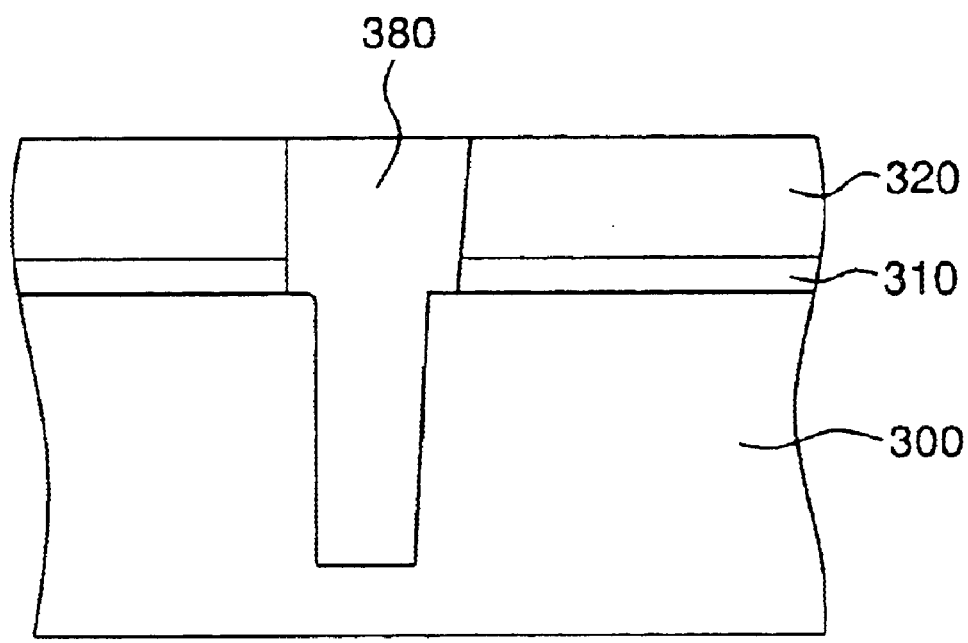

FIG. 3E illustrates a structure after the second dielectric layer 330 is removed, an oxide layer 380 is used to fill in the trench 340, and a CMP process is performed to remove a portion of the oxide layer 380 above the hard mask layer 330.

According to the structure of FIG. 3D, the second dielectric layer 330 is removed before the oxide layer 380 is filled in the trench 340. The oxide layer 380 is filled in the trench 340 and planarizes the surface of the substrate. Usually, the oxide layer 380 has a good gap-filling ability. For example, the oxide layer 380 can be formed by high density plasma CVD (HDP CVD). Then a CMP process is performed to remove the oxide layer 380 above the hard mask layer 320 by using the hard mask layer 320 as a CMP stop layer. If the second dielectric layer 330 is not removed before the oxide layer 380 is filled in the trench 340, it can be removed by the CMP process. In some embodiments, the CMP process has a high removal rate for the second dielectric layer 330 than for the hard mask layer 320.

As mentioned above, because the hard mask layer 320 is protected by the second dielectric layer 330 from all plasma damages resulting from the pull-back process, the hard mask layer 320 is intact. Therefore, the CMP process can be easily controlled and the issue regarding deviations of critical condition (CD) in a following photographic process for gate patterns can be resolved.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of pull back for shallow trench isolation, comprising:

providing a substrate having a hard mask layer formed thereupon and a dielectric layer above said hard mask layer;

forming a trench within said hard mask layer, said dielectric layer and said substrate; and pulling back said hard mask layer and said dielectric layer by a dry etching process using a halogen containing etching gas.

2. The method of claim 1, wherein said dielectric layer is used as an etching protection layer for said hard mask layer.

3. The method of claim 1, wherein said hard mask layer is another dielectric layer for which a chemical-mechanical polish (CMP) process has a removal rate different from that of said dielectric layer.

4. The method of claim 1, wherein said dielectric layer is used as a lithographic ARC layer for controlling depth of focus (DOF) of a photolithographic process.

5. The method of claim 4, wherein said hard mask layer is a silicon nitride layer.

6. The method of claim 5, wherein said dielectric layer is an oxynitride layer.

7. The method of claim 6, wherein said oxynitride layer has a thickness from about 200 Å to about 600 Å.

8. The method of claim 6, wherein said oxynitride layer has a reflective index from about 1.5 to about 2.5 and extinction coefficient from about 0.1 to about 0.6.

9. The method of claim 1, wherein said halogen containing etching gas comprises a fluorine containing etching gas.

10. The method of claim 9, wherein said fluorine containing etching gas further comprises a carbon component.

11. The method of claim 10, wherein a ratio of fluorine over carbon (F/C) of said fluorine containing gas is higher than, or equal to, 1.

12. The method of claim 9, wherein said fluorine containing etching gas comprises a mixture of $CF_4$ and $CHF_3$.

13. The method of claim 9, wherein said fluorine containing etching gas is selected from a group consisting of $C_xF_y$, $C_xH_yF_z$, $S_xF_y$, $N_xF_y$ and mixtures thereof.

14. The method of claim 13, wherein said halogen containing etching gas comprises a nitrogen component.

15. The method of claim 14, wherein said halogen containing etching gas further comprises an inert gas component.

16. The method of claim 1, wherein said dry etching process is performed in a tool having a Transformer-Coupled Plasma (TCP) power and a bias power.

17. The method of claim 16, wherein said TCP power is higher than said bias power.

18. The method of claim 17, wherein a ratio of TCP power over said bias power is more than, or equal to, 5.

19. The method of claim 16, wherein a ratio of said TCP power over said bias power from about 5 to about 10 can control a lateral/perpendicular etching ratio of said dry etching process from about 2 to about 4.

20. The method of claim 1, wherein said dry etching process has an etching rate in lateral direction more twice than in perpendicular direction.

21. A method of pull back for shallow trench isolation, comprising:

providing a substrate having a first dielectric layer and a second dielectric layer above said substrate, wherein said second dielectric layer is used as an etching protection layer for said first dielectric layer;

forming a trench within said first dielectric layer, said second dielectric layer and said substrate; and p1 pulling back said first dielectric layer and said second dielectric layer by a dry etching process using a fluorine containing etching gas.

22. The method of claim 21, wherein said first dielectric layer is a silicon nitride layer.

23. The method of claim 22, wherein said second dielectric layer is an oxynitride layer.

24. The method of claim 23, wherein said oxynitride layer has a thickness from about 200 Å to about 600 Å.

25. The method of claim 21, wherein said fluorine containing etching gas further comprises a carbon component.

26. The method of claim 25, wherein a fluorine to carbon (F/C) ratio of said fluorine containing gas is higher than, or equal to, 1.

27. The method of claim 21, wherein said fluorine containing etching gas is selected from a group consisting of $C_xF_y$, $C_xH_yF_z$, $S_xF_y$, $N_xF_y$ and mixtures thereof.

28. The method of claim 21, wherein said fluorine containing etching gas comprises a mixture of $CF_4$ and $CHF_3$.

29. The method of claim 21, wherein said dry etching process is performed in a tool having a Transformer-Coupled Plasma (TCP) power and a bias power.

30. The method of claim 29, wherein said TCP power is higher than said bias power.

31. The method of claim 30, wherein a ratio of TCP power over said bias power is more than, or equal to, 5.

32. The method of claim 29, wherein a ratio of said TCP power over said bias power from about 5 to about 10 can control a lateral/perpendicular etching ratio of said dry etching process from about 2 to about 4.

33. The method of claim 21, wherein said dry etching process has an etching rate in lateral direction more twice than in perpendicular direction.

* * * * *